US008872524B2

(12) United States Patent
Hori et al.

(10) Patent No.: US 8,872,524 B2
(45) Date of Patent: Oct. 28, 2014

(54) SWITCHING APPARATUS, SWITCHING APPARATUS MANUFACTURING METHOD, TRANSMISSION LINE SWITCHING APPARATUS, AND TEST APPARATUS

(75) Inventors: Hisao Hori, Miyagi (JP); Yoshikazu Abe, Miyagi (JP); Yoshihiro Sato, Miyagi (JP)

(73) Assignee: Advantest Corporation, Tokyo (JP)

( * ) Notice: Subject to any disclaimer, the term of this patent is extended or adjusted under 35 U.S.C. 154(b) by 461 days.

(21) Appl. No.: 13/279,323

(22) Filed: Oct. 23, 2011

(65) Prior Publication Data

US 2013/0027057 A1 Jan. 31, 2013

(30) Foreign Application Priority Data

Jul. 26, 2011 (JP) ................................. 2011-163285

(51) Int. Cl.
*G01R 31/00* (2006.01)
*H01H 57/00* (2006.01)
*G01R 31/06* (2006.01)
*G01R 31/327* (2006.01)

(52) U.S. Cl.
CPC ............... *G01R 31/06* (2013.01); *H01H 57/00* (2013.01); *H01H 2057/006* (2013.01); *G01R 31/3277* (2013.01)
USPC ........................................................ 324/555

(58) Field of Classification Search
None
See application file for complete search history.

(56) References Cited

U.S. PATENT DOCUMENTS

| 7,554,136 B2* | 6/2009 | Takayanagi et al. ........... 257/254 |
| 8,436,432 B2* | 5/2013 | Mao et al. ...................... 257/415 |
| 2008/0060188 A1* | 3/2008 | Ning et al. ...................... 29/611 |
| 2013/0026021 A1* | 1/2013 | Hori et al. ...................... 200/5 A |
| 2013/0037395 A1* | 2/2013 | Hori et al. ...................... 200/181 |
| 2013/0038335 A1* | 2/2013 | Hori et al. ...................... 324/537 |

FOREIGN PATENT DOCUMENTS

| JP | 2001-129800 A | 5/2001 |
| JP | 2001-191300 A | 7/2001 |
| JP | 2004-335216 A | 11/2004 |
| JP | 2005-311415 A | 11/2005 |
| JP | 2008-42191 A | 2/2008 |
| JP | 2008-238330 A | 10/2008 |
| JP | 2010-34148 A | 2/2010 |
| JP | 2011-129369 A | 6/2011 |
| WO | 2007/083769 A1 | 7/2007 |

OTHER PUBLICATIONS

"Notice of Reasons for Rejection" Issued by the Japan Patent Office for application No. 2011-163285.

* cited by examiner

*Primary Examiner* — Vinh Nguyen

(57) ABSTRACT

A package of a switching apparatus that houses an actuator having a movable contact point and in which a fixed contact point, which is electrically connected to or disconnected form the movable contact point, is accurately formed. Provided is a switching apparatus comprising a first substrate provided with a via that electrically connects a top surface thereof and a bottom surface thereof, while maintaining an air-tight state between the top surface and the bottom surface; a second substrate provided on the first substrate and in which is formed a through-hole that houses an actuator; and a third substrate provided on the second substrate and supporting the actuator, which has a moveable contact point.

20 Claims, 10 Drawing Sheets

SWITCHING APPARATUS, SWITCHING APPARATUS MANUFACTURING METHOD, TRANSMISSION LINE SWITCHING APPARATUS, AND TEST APPARATUS

BACKGROUND

1. Technical Field

The present invention relates to a switching apparatus, a switching apparatus manufacturing method, a transmission line switching apparatus, and a test apparatus.

2. Related Art

An actuator is known that is formed on a semiconductor substrate, includes piezoelectric film and electrodes applying voltage to the piezoelectric film, and operates according to expansion and contraction of the piezoelectric film by applying voltage thereto, as shown in Patent Document 1, for example.

Patent Document 1: Japanese Patent Application Publication No. 2001-191300

When packaging this actuator to form a switching apparatus, a glass substrate etched to have a cavity housing the actuator and a semiconductor substrate on which the actuator is formed are bonded together. However, structures such as a fixed contact point that is electrically connected to or disconnected from a movable contact point or vias that transmit electrical signals to the outside of the package must be formed on the actuator by precise machining on the surface of the glass substrate made rough by etching, and this makes accurate machining difficult.

SUMMARY

Therefore, it is an object of an aspect of the innovations herein to provide a switching apparatus, a switching apparatus manufacturing method, a transmission line switching apparatus, and a test apparatus, which are capable of overcoming the above drawbacks accompanying the related art. The above and other objects can be achieved by combinations described in the independent claims. The dependent claims define further advantageous and exemplary combinations of the innovations herein. According to a first aspect related to the innovations herein, provided is a switching apparatus comprising a first substrate provided with a via that electrically connects a top surface thereof and a bottom surface thereof, while maintaining an air-tight state between the top surface and the bottom surface; a second substrate provided on the first substrate and in which is formed a through-hole that houses an actuator; and a third substrate provided on the second substrate and supporting the actuator, which has a moveable contact point.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
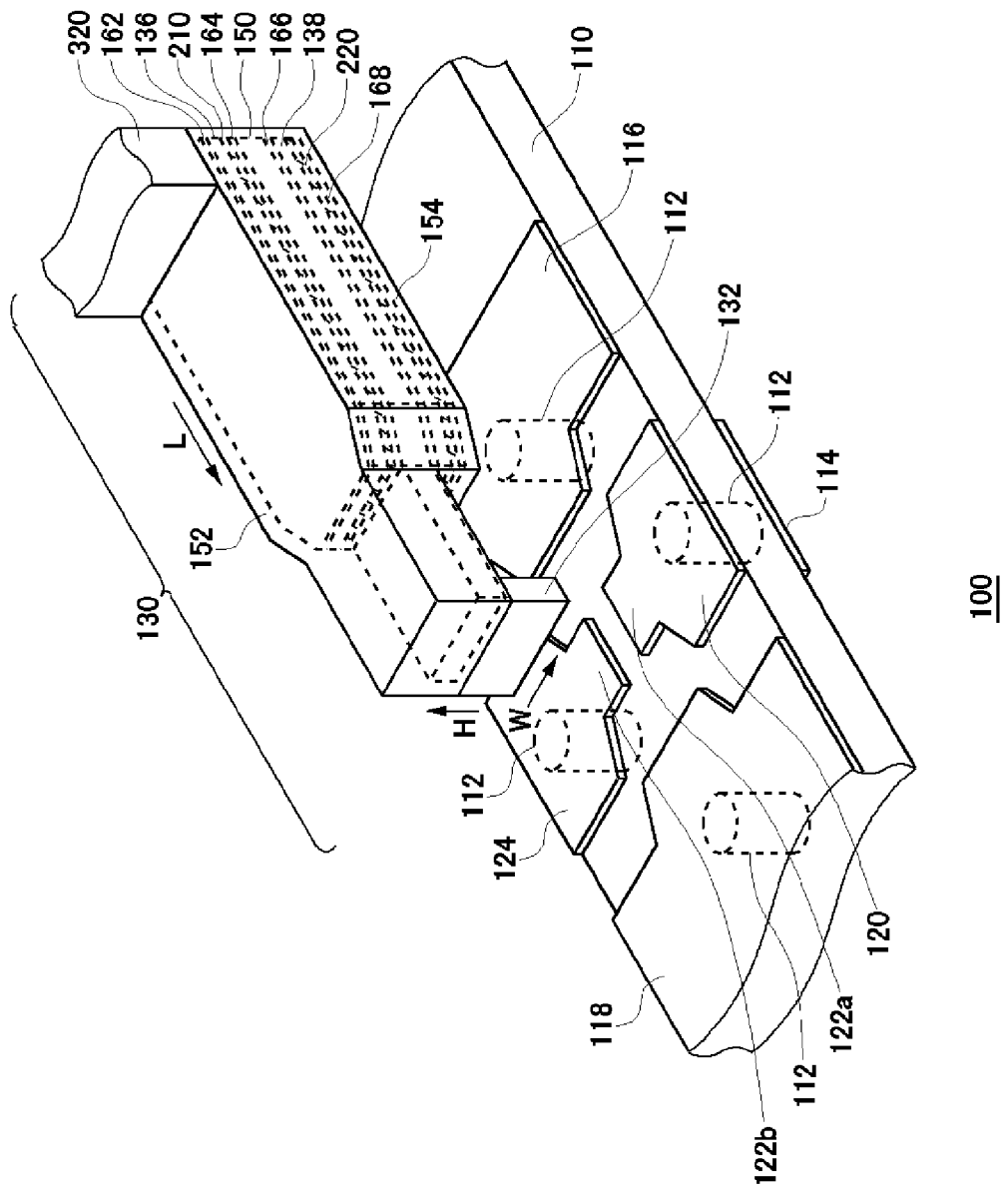
FIG. 1 shows an exemplary configuration of a switching apparatus 100 according to an embodiment of the present invention.
Figure 2:
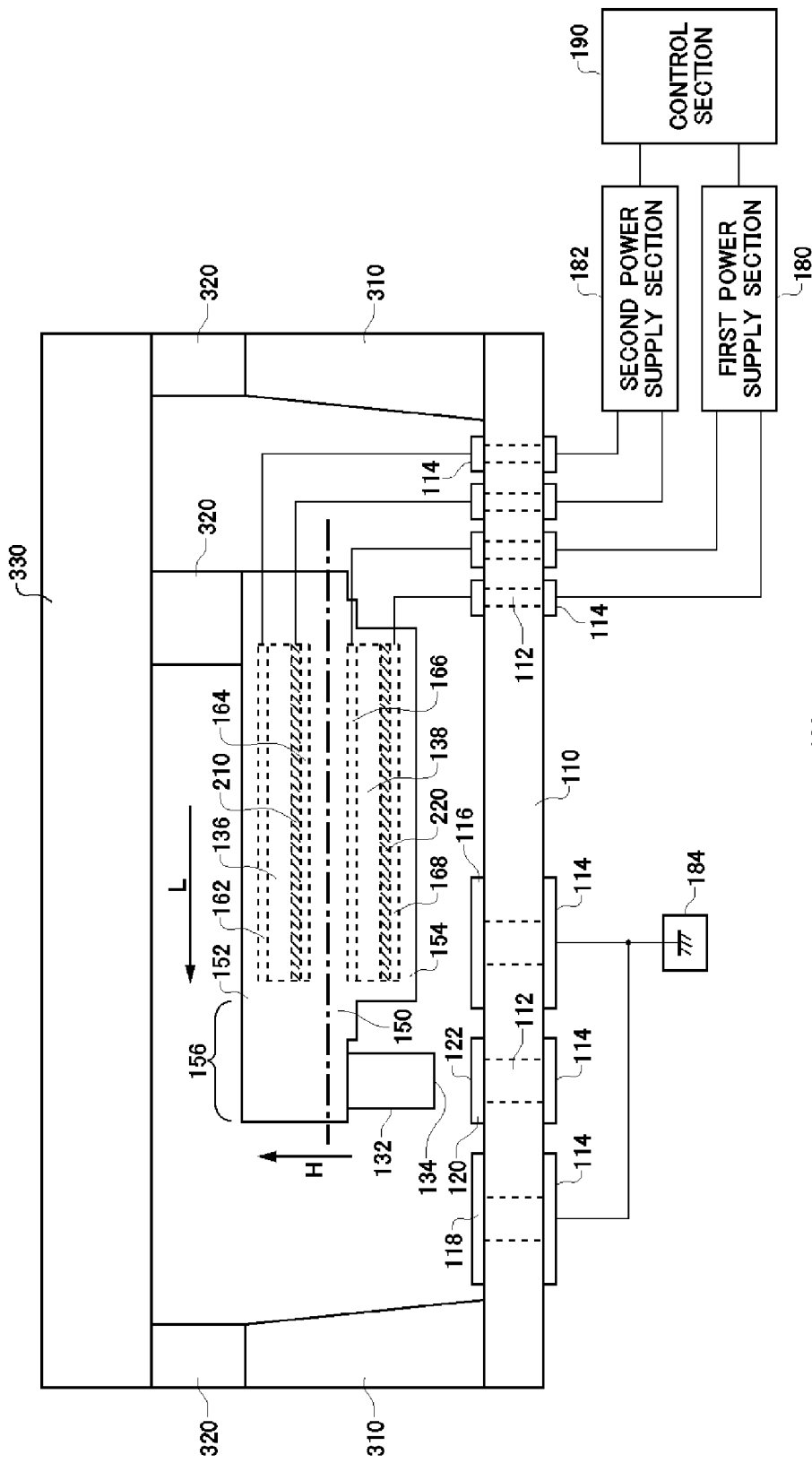
FIG. 2 shows a side view of the switching apparatus 100 according to the present embodiment.

FIG. 1 shows an exemplary configuration of a switching apparatus 100 according to an embodiment of the present invention. FIG. 2 shows a side view of the switching apparatus 100 according to the present embodiment. The switching apparatus 100 includes conductive oxide films between piezoelectric films and electrodes applying voltage to the piezoelectric films, and increases the lifespan of the piezoelectric films. Furthermore, the switching apparatus 100 prevents physical damage to the actuator 130 such as cracking, chipping, or fracturing, while increasing the rigidity of the actuator 130.

The switching apparatus 100 causes first contact points 122, which are fixed contact points formed on the lower substrate section, and a second contact point 134, which is a movable contact point formed on the actuator, to be in contact with each other or move away from each other, thereby switching the fixed contact points and the movable contact point between an electrically conductive state and a non-conductive state. The switching apparatus 100 may be housed and sealed in a package, for example. The switching apparatus 100 includes a lower substrate section 110, an actuator 130, a first power supply section 180, a second power supply section 182, a reference voltage 184, a control section 190, a cavity section 310, a base portion 320, and an upper substrate section 330.

The lower substrate section 110 includes a flat first surface on which the fixed contact point is disposed. The lower substrate section 110 may include wiring sections for exchanging electrical signals or power, for example, with the outside, disposed on a second surface that is different from the first surface. The lower substrate section 110 may be an insulator such as a glass substrate, or may be a semiconductor substrate made of silicon, for example. Instead, the lower substrate section 110 may be a metal substrate. The lower substrate section 110 includes vias 112, wiring sections 114, a ground line 116, a ground line 118, a first signal line 120, a first contact point 122a, a first contact point 122b, and a second signal line 124.

The vias 112 penetrate through the lower substrate section 110 and are coated with metal to provide an electrical connection between the electrical wiring formed on the first surface and the electrical wiring formed on the second surface. For example, a via 112 may provide an electrical connection between the first contact point 122 and a wiring section 114 formed on the second surface. The vias 112 may be filled with a conductive material to keep through-holes formed between the top surface and the bottom surface of the lower substrate section 110 in a sealed state. A plurality of vias 112 may be provided to the lower substrate section 110, such that the number of vias 112 corresponds to the number of electrical signals or power supplies supplied to the actuator 130 and the number of first contact points 122 in the lower substrate section 110.

The wiring sections 114 transmit a signal passed through the switching apparatus 100, an electrical signal supplied to the actuator 130, or a power supply voltage, for example. The wiring sections 114 may be a wiring pattern provided on the first surface or second surface of the lower substrate section 110 to transmit or receive a signal to or from at least one via 112. Instead, the wiring sections 114 may be formed on a first surface or a second surface of the upper substrate section 330. The wiring sections 114 may include a land, a connector, and/or an antenna, and may transmit and receive signals passed through the switching apparatus 100 from the outside.

The ground line 116 and the ground line 118 are provided on the first surface of the lower substrate section 110, and are connected to the reference voltage 184 through vias 112 and wiring sections 114. The ground line 116 and the ground line 118 may be conductive wiring patterns.

The first signal line 120 and the second signal line 124 are formed on the first surface of the lower substrate section 110, between the ground line 116 and the ground line 118. The first signal line 120 and the second signal line 124 may be conductive wiring patterns.

The ground line 116, the ground line 118, the first signal line 120, and the second signal line 124 may form a coplanar transmission line. In other words, the line width of the first signal line 120 and the second signal line 124, the interval between the ground line 116 and the first signal line 120, the interval between the ground line 116 and the second signal line 124, the interval between the ground line 118 and the first signal line 120, and the interval between the ground line 118 and the second signal line 124 are formed to be predetermined values according to the characteristic impedance of the first signal line 120 and the second signal line 124. As a result, the first signal line 120 and the second signal line 124 can transmit signals with high frequencies up to tens of GHz.

If the electrical signals passed through the switching apparatus 100 have low enough frequencies to be transmitted without forming a coplanar transmission line, then the ground line 116 and the ground line 118 need not be included.

The first contact point 122a is provided on the first signal line 120, and the first contact point 122b is provided on the second signal line 124. The first contact points 122 may each be a flat surface without any protrusions. The first contact points 122 may include aluminum, tungsten, palladium, rhodium, gold, platinum, ruthenium, indium, iridium, osmium, molybdenum, and/or nickel. The first contact points 122 may be an alloy of two or more of the above materials.

The first signal line 120 and the second signal line 124 may be formed of substantially the same material as the first contact points 122.

The actuator 130 includes a second contact point 134, and moves the second contact point 134 to contact or move away from the first contact points 122. The actuator 130 may be deposited by a semiconductor manufacturing apparatus using a sol-gel technique and CVD (Chemical Vapor Deposition). The actuator 130 includes a second contact point section 132, a first piezoelectric film 136, a second piezoelectric film 138, a support layer 150, a first protective film 152, a second protective film 154, a protruding section 156, a first electrode layer 162 and second electrode layer 164 of the first piezoelectric film 136, a third electrode layer 166 and a fourth electrode layer 168 of the second piezoelectric film 138, a first conductive oxide film 210, and a second conductive oxide film 220.

The second contact point section 132 includes the second contact point 134. The second contact point section 132 may include the same metal as the first contact points 122. The second contact point 134 may include a protrusion. Instead, the second contact point 134 may be a flat surface without a protrusion.

The second contact point 134 may be semispherical in order to prevent degradation or damage of the first contact points 122, or may have a tip shaped as a rounded needle. For example, the second contact point 134 may have a predetermined shape that, when the second contact point 134 contacts the first contact points 122 to form a transmission line, creates a transmission line having a width corresponding to the frequency of the signal being transmitted.

In the present embodiment, the switching apparatus 100 includes two first contact points 122a and 122b of the lower substrate section 110, and these contact points 122 are brought into contact with and moved away from one second contact point 134. In this way, the switching apparatus 100 can switch between an electrically conductive state and an electrically non-conductive state between the first contact point 122a and the first contact point 122b via the second contact point 134. A wiring section 114 transmits a signal from the outside to the first contact point 122a, and this signal is transmitted from the first contact point 122b to the outside when the switching apparatus 100 is ON, for example.

Instead, the switching apparatus 100 may include one first contact point 122 on the lower substrate section 110, and wiring that transmits an electrical signal from the outside to the second contact point 134 may be provided on the actuator 130. This wiring may transmit the electrical signal from the outside to a first contact point 122, receive the electrical signal via the second contact point 134, and transmit the electrical signal to the outside. In this way, the switching apparatus 100 can switch the signal transmission from the second contact point 134 to the first contact point 122 ON/OFF, and may transmit a signal, received from the outside, to the outside from the second contact point 134 via a first contact point 122 when the switching apparatus 100 is ON.

The first piezoelectric film 136 is formed on the top surface of the support layer 150. The first piezoelectric film 136 may expand and contract according to a first drive voltage. In this case, when the first drive voltage is applied, the first piezoelectric film 136 expands or contracts in the longitudinal direction of the actuator 130, thereby causing the actuator 130 to bend in a direction that changes the distance between the first contact points 122 and the second contact point 134.

The first piezoelectric film 136 may be formed of Perovskite ferroelectric substances such as barium titanate (BTO), lead lanthanum zirconate titanate (PLZT), Lead zirconate titanate (PZT), aluminum nitride (AlN), or a zinc oxide (ZnO) wurtzite crystal.

The second piezoelectric film 138 is provided on a different surface of the support layer 150 than the surface on which the first piezoelectric film 136 is formed, faces the first piezoelectric film 136 via the support layer 150, and expands and contracts according to a second drive voltage to change the bowing amount of the actuator 130. When the second drive voltage is applied, the second piezoelectric film 138 expands or contracts in the longitudinal direction of the actuator 130, thereby causing the actuator 130 to bend in a direction that changes the distance between the first contact points 122 and the second contact point 134.

The second piezoelectric film 138 may be formed using Perovskite ferroelectric substances, in the same manner as the first piezoelectric film 136. The second piezoelectric film 138 preferably uses substantially the same material and has substantially the same shape as the first piezoelectric film 136. Furthermore, the thickness of the first piezoelectric film 136 and the second piezoelectric film 138 may be within a range from 0.1 µm to 5 µm. If the first piezoelectric film 136 and the second piezoelectric film 138 are formed by depositing PZT, the deposition of the PZT may be performed after depositing lead titanate (PT). As a result, the PZT can be formed with good crystallinity.

The first piezoelectric film 136 restricts bowing of the actuator 130 when the second drive voltage is not applied to the second piezoelectric film 138. The first piezoelectric film 136 uses substantially the same material and has substantially the same shape as the second piezoelectric film 138, and is provided on the opposite surface of the actuator 130 from the second piezoelectric film 138. Therefore, the first piezoelectric film 136 exerts a stress that bows the actuator 130 in a direction opposite the bowing caused by the second piezoelectric film 138, thereby restricting the bowing of the actuator 130.

The first piezoelectric film 136 restricts bowing of the actuator 130 caused by expansion and contraction due to temperature change of the second piezoelectric film 138. The second piezoelectric film 138 is formed by layering films made of materials having different thermal expansion coefficients, and therefore the second piezoelectric film 138 deforms in response to thermal stress caused by temperature change, thereby causing bowing of the actuator 130. The first piezoelectric film 136 uses substantially the same material and has substantially the same shape as the second piezoelectric film 138, and is provided on the opposite surface of the actuator 130 from the second piezoelectric film 138. Therefore, the first piezoelectric film 136 exerts a stress that bows the actuator 130 in a direction opposite the bowing caused by the temperature change, thereby restricting the bowing of the actuator 130 due to temperature change.

The support layer 150 is provided between the first piezoelectric film 136 and the second piezoelectric film 138. The support layer 150 is elastic and deforms when force is applied thereto, so that the support layer 150 bends when the first piezoelectric film 136 and/or the second piezoelectric film 138 expands or contracts to exert a force on the support layer 150. The support layer 150 is rigid enough to prevent the actuator 130 from being bent too much, and to return the actuator 130 to the initial position when the application of the electric field of the first piezoelectric film 136 and the second piezoelectric film 138 is stopped.

When forming the first piezoelectric film 136 and/or the second piezoelectric film 138, the support layer 150 is heated to a firing temperature along with the piezoelectric films. In other words, the first piezoelectric film 136 and the second piezoelectric film 138 are heated to the firing temperature thereof to be formed on different surfaces of the support layer 150, and therefore the support layer 150 is heated to the firing temperature along with the first piezoelectric film 136 and/or the second piezoelectric film 138.

Therefore, the support layer 150 is made from a material that is not damaged when heated to the firing temperature of the first piezoelectric film 136 and/or the second piezoelectric film 138. If the first piezoelectric film 136 and the second piezoelectric film 138 are made of PZT, for example, the firing temperature can exceed 700° C. Accordingly, the support layer 150 is preferably made of a material that does not exhibit physical damage such as cracking, chipping, or fracturing when heated to the firing temperature of the first piezoelectric film 136 and/or the second piezoelectric film 138.

Furthermore, the support layer 150 is preferably made of a material that is unlikely to cause a chemical reaction with the piezoelectric films or the electrode layers when heated to the firing temperature of the first piezoelectric film 136 and the second piezoelectric film 138. The first support layer 150 is preferably made of a material that forms a compound with the piezoelectric films or the electrode layers as a result of being heated to the firing temperature of the piezoelectric films, and that does not exhibit physical damage such as cracking, chipping, or fracturing. In this case, the support layer 150 is preferably made of a material that does not degrade the film characteristics, such as the piezoelectric constant, of the first piezoelectric film 136 or the second piezoelectric film 138 when heated to the firing temperature of the piezoelectric films.

The support layer is formed of an insulating material. By using an insulating material, the support layer 150 can tolerate the firing temperature of the piezoelectric films at approximately 700° C. and can be formed in a short time using a method such as CVD that is less expensive than a metal film.

The support layer 150 may include silicon oxide ($SiO_2$) or silicon nitride (SiN). Instead, the support layer 150 may use a conductor such as aluminum, gold, or platinum, an insulator such as glass, or a semiconductor such as silicon. The thickness of the support layer 150 may be in a range from 0.1 µm to 50 µm.

The first protective film 152 is formed of an insulating material, covers at least a portion of the first piezoelectric film 136 from a side thereof that is opposite the support layer 150, and contacts the support layer 150 across at least a portion of the tip of the first piezoelectric film 136. The first protective film 152 and the support layer 150 may be formed to cover the first piezoelectric film 136, the first electrode layer 162, and the second electrode layer 164 such that these layers are not exposed. Here, the first protective film 152 and the support layer 150 may be formed to expose connecting sections that are used to connect the first electrode layer 162 and the second electrode layer 164 to the wiring sections 114.

The first protective film 152 and the support layer 150 may be formed to cover a portion of the first piezoelectric film 136, the first electrode layer 162, and the second electrode layer 164. For example, the first protective film 152 and the support layer 150 may cover a side portion of each layer. In other words, the first protective film 152 and the support layer 150 may cover a side portion of the actuator 130. The first protective film 152 and the support layer 150 may cover the support layer 150 side of the actuator 130.

The second protective film 154 is formed of an insulating material, covers at least a portion of the second piezoelectric film 138 from the side opposite the support layer 150, and contacts the support layer 150 at least at the end portion of the second piezoelectric film 138. The second protective film 154 and the support layer 150 may be formed to cover the second piezoelectric film 138, the fourth electrode layer 168, and the third electrode layer 166 such that none of these layers are exposed. The second protective film 154 and the support layer 150 may be formed to expose connecting portions that connect the wiring sections 114 to the first electrode layer 162, the second electrode layer 164, the fourth electrode layer 168, and the third electrode layer 166.

The second protective film 154 and the support layer 150 may be formed to cover a portion of the second piezoelectric film 138, the fourth electrode layer 168, and the third electrode layer 166. For example, the second protective film 154 and the support layer 150 may cover a side portion of each layer. In other words, the second protective film 154 and the support layer 150 may cover a side portion of the actuator 130. The second protective film 154 and the support layer 150 may cover the support layer 150 side of the actuator 130.

The first protective film 152 and the second protective film 154 may be formed of silicon oxide or silicon nitride. The first protective film 152 and the second protective film 154 may be formed of a similar type of insulating material as the support layer 150, and are preferably formed of substantially the same insulating material as the support layer 150. In other words, the first protective film 152 and the second protective film 154 are formed to be both elastic and rigid, to effectively seal with the support layer 150, and to have a strong connection, in the same manner as the support layer 150. In the present embodiment, the first protective film 152 and the second protective film 154 are formed of the same insulating material as the support layer 150, and the interfaces between these layers are not shown in FIG. 2.

The protruding section 156 is a tip portion of the actuator 130 that is the movable portion, and this is a portion of the support layer 150 on which the first piezoelectric film 136 and second piezoelectric film 138 are not provided. The second contact point section 132 may be provided on the protruding section 156. In this way, the second contact point 134 can be formed at a position distanced from the first electrode layer 162, the second electrode layer 164, the third electrode layer 166, and the fourth electrode layer 168, and can decrease the effect of the electrical signal supplied to each of the electrode layers.

The protruding section 156 can be arranged to distance the first electrode layer 162, the second electrode layer 164, the third electrode layer 166, and the fourth electrode layer 168 from the transmission line from the first signal line 120 to the second signal line 124, when the first contact points 122 and the second contact point 134 are in contact to achieve the ON state. In this way, the protruding section 156 can decrease the effect of noise, caused by electrical signals supplied to the electrode layers, on the coplanar transmission line.

The first electrode layer 162 and the second electrode layer 164 are respectively formed on the top and bottom surfaces of the first piezoelectric film 136, and apply the first drive voltage to the first piezoelectric film 136. The first drive voltage may be a prescribed voltage that is positive or negative.

The first electrode layer 162 and the second electrode layer 164 may each be flat and extend in the length direction L of the actuator 130. The first electrode layer 162 and the second electrode layer 164 may be made from metals that can be easily machined with low resistance, such as aluminum, gold, platinum, copper, indium, tungsten, molybdenum, ruthenium, and iridium, oxide compound electrodes such as ruthenium oxide ($RuO_x$, e.g. $RuO_2$) and iridium oxide ($IrO_x$, e.g. $IrO_2$), ceramic electrodes, or semiconductors such as silicon.

If silicon is used as the electrode material, the silicon is preferably doped to have high impurity density. The first electrode layer 162 and the second electrode layer 164 of the present embodiment are each made of platinum. If platinum is deposited, the platinum may be deposited after depositing titanium, tantalum, or chrome, for example.

The third electrode layer 166 and the fourth electrode layer 168 are respectively formed on the top and bottom surfaces of the second piezoelectric film 138, and apply the second drive voltage to the second piezoelectric film. The second drive voltage may be a prescribed voltage that is positive or negative. The third electrode layer 166 and the fourth electrode layer 168 may each be flat and extend in the length direction L of the actuator 130. The third electrode layer 166 and the fourth electrode layer 168 may be made of the substantially same material as and have substantially the same shape as the first electrode layer 162 and the second electrode layer 164.

As another example, the third electrode layer 166 may be made of the substantially same material as and have substantially the same shape as the second electrode layer 164, and the fourth electrode layer 168 may be made of the substantially same material as and have substantially the same shape as the first electrode layer 162. The first electrode layer 162, the second electrode layer 164, the third electrode layer 166, and the fourth electrode layer 168 may each have a thickness in a range from 0.05 μm to 1 μm.

The first conductive oxide film 210 is formed between the first piezoelectric film 136 and the second electrode layer 164. The first conductive oxide film includes a conductive oxide. The main component included in the first conductive oxide film 210 may be an Ir-type oxide such as $IrO_2$, a Ru-type oxide such as $RuO_2$ or SRO, or oxides such as LSCO or LNO.

The first conductive oxide film 210 is formed on the first piezoelectric film 136 and decreases wear caused by the expansion and contraction of the first piezoelectric film 136. The repeated expansion and contraction of the first piezoelectric film 136 releases the oxygen contained in the piezoelectric film resulting in the accumulation of wear, and this is believed to decrease the lifespan of the piezoelectric film. Therefore, since the first conductive oxide film 210 includes oxide and contacts the first piezoelectric film 136, the first conductive oxide film 210 can prevent the release of oxygen from the first piezoelectric film 136.

Furthermore, the first conductive oxide film 210 can supply oxygen to a portion of the first piezoelectric film 136 from which oxygen has escaped. In this way, the first conductive oxide film 210 can prevent oxygen deficient regions from being formed in the first piezoelectric film 136, thereby increasing the lifespan of the first piezoelectric film 136.

The second conductive oxide film 220 is formed between the second piezoelectric film 138 and the fourth electrode layer 168. The second conductive oxide film 220 includes a conductive oxide. The main component included in the second conductive oxide film 220 may be an Ir-type oxide such as $IrO_2$, a Ru-type oxide such as $RuO_2$ or SRO, or oxides such as LSCO or LNO, and the second conductive oxide film 220 may be formed of the same material as the first conductive oxide film 210.

The second conductive oxide film 220 is formed on the second piezoelectric film 138 and decreases wear caused by the expansion and contraction of the second piezoelectric film 138. In other words, in the same manner as the first conductive oxide film 210, the second conductive oxide film 220 can prevent oxygen deficient regions from being formed in the second piezoelectric film 138, thereby increasing the lifespan of the second piezoelectric film 138.

The first power supply section 180 applies the first drive voltage to the first piezoelectric film 136. The first power supply section 180 receives a control signal from the control section 190, and applies a voltage corresponding to the control signal to the first piezoelectric film 136 as the first drive voltage. The second power supply section 182 applies the second drive voltage to the second piezoelectric film 138. The second power supply section 182 receives a control signal from the control section 190, and applies a voltage corresponding to the control signal to the second piezoelectric film 138 as the second drive voltage.

The reference voltage 184 supplies a predetermined voltage. In the present embodiment, the reference voltage 184 is a GND voltage of 0 V.

The control section 190 transmits a control signal to the first power supply section 180 and/or the second power supply section 182, to instruct whether a drive voltage for expanding or contracting the first piezoelectric film 136 and/or the second piezoelectric film 138 is to be applied or not. For example, when bringing the first contact point 122 and the second contact point 134 into contact with each other to turn ON the switching apparatus 100, the control section 190 transmits to the second power supply section 182 a control signal for contracting the second piezoelectric film 138 by applying the second drive voltage to the second piezoelectric film 138. When moving the first contact points 122 and the second contact point 134 away from each other to turn OFF the switching apparatus 100, the control section 190 transmits to the second power supply section 182 a control signal that stops the supply of the second drive voltage to the second piezoelectric film 138.

Instead, when bringing the first contact point 122 and the second contact point 134 into contact with each other to turn ON the switching apparatus 100, the control section 190 may transmit to the first power supply section 180 a control signal for expanding the first piezoelectric film 136 by applying the first drive voltage to the first piezoelectric film 136. When moving the first contact points 122 and the second contact point 134 away from each other to turn OFF the switching apparatus 100, the control section 190 may transmit to the first power supply section 180 a control signal that stops the supply of the first drive voltage to the first piezoelectric film 136.

As another example, when bringing the first contact points 122 and the second contact point 134 into contact with each other to turn ON the switching apparatus 100, the control section 190 may cause the first piezoelectric film 136 to expand by applying the first drive voltage to the first piezoelectric film 136 and cause the second piezoelectric film 138 to contract by applying the second drive voltage to the second piezoelectric film 138. When moving the first contact points 122 and the second contact point 134 away from each other to turn OFF the switching apparatus 100, the control section 190 may stop the supply of the drive voltages to the first piezoelectric film 136 and the second piezoelectric film 138.

As yet another example, when moving the first contact points 122 and the second contact point 134 away from each other to turn OFF the switching apparatus 100, the control section 190 may cause the first piezoelectric film 136 to contract in order to bias the actuator 130 in a return direction. Similarly, when turning OFF the switching apparatus 100, the control section 190 may cause the second piezoelectric film 138 to expand in order to bias the actuator 130 in the return direction.

The control section 190 may supply the first piezoelectric film 136 and the second piezoelectric film 138 respectively with predetermined values as the first drive voltage and the second drive voltage. The control section 190 may be hardware such as an electronic circuit, or may be software that operates according to a program, for example.

The cavity section 310 is provided on the lower substrate section 110 and forms a portion of the side walls of the switching apparatus 100 to cover the actuator 130 on four sides and house the actuator 130. The cavity section 310 may be formed of substantially the same material as the lower substrate section 110.

The base portion 320 is formed on the cavity section 310, and a portion of the base portion 320 is fixed to one end of the actuator 130 to create a fixed end of the actuator 130. By bonding the base portion 320 to the cavity section 310, the distance between the first contact points 122 and the second contact point 134 can be set to be less than or equal to the maximum displacement amount of the actuator 130. In other words, the height of the cavity section 310, which is the distance between the base portion 320 and the lower substrate section 110, can be adjusted to adjust the distance between the first contact points 122 and the second contact point 134.

The maximum displacement of the actuator 130 may refer to the displacement of the actuator 130 when the maximum drive voltage is applied to the first piezoelectric film 136 and/or the second piezoelectric film 138. The base portion 320 may be formed by etching a semiconductor material. For example, the base portion 320 may be formed from a silicon substrate. In this case, the base portion 320 may be bonded to the cavity section 310 using anodic bonding.

In this way, one end of the actuator 130 in the length direction L is supported by the base portion 320. When a voltage is applied to the first piezoelectric film 136 or the second piezoelectric film 138, the end of the actuator 130 on the second contact point section 132 side that is not supported by the base portion 320 bends in the thickness direction, which results in downward displacement or upward displacement in FIG. 2.

The upper substrate section 330 is provided on the base portion 320, and forms a lid of a package of the switching apparatus 100 formed by the lower substrate section 110, the cavity section 310, and the base portion 320. The upper substrate section 330 may be a substrate formed of glass, for example. In this case, the upper substrate section 330 may be bonded to the base portion 320 using anodic binding.

The present embodiment describes an example in which the base portion 320 fixes the actuator 130 to the upper substrate section 330, but instead, the actuator 130 may be fixed to the lower substrate section 110 or the cavity section 310.

The switching apparatus 100 of the present embodiment described above includes the first piezoelectric film 136 and the second piezoelectric film 138 having substantially the same thickness and located at substantially the same distance from a central plane in the thickness direction of the actuator 130, and therefore the stress causing the bowing generated by the first piezoelectric film 136 is substantially equal to the stress restricting the bowing generated by the second piezoelectric film 138. Furthermore, since the actuator 130 is formed of a plurality of films formed substantially symmetrically with respect to the central plane of the actuator 130 in the thickness direction, the residual stress, thermal stress, or the like due to the layering of a plurality of films that causes the actuator 130 to move in a direction resulting in bowing and the residual stress, thermal stress, or the like that causes the actuator 130 to move in a direction opposite the bowing are substantially the same, thereby restricting bowing of the actuator 130.

In this way, the actuator 130 can restrict bowing caused by thermal stress, and therefore the actuator 130 can achieve the switching operation in a variety of temperature environments. Furthermore, the actuator 130 includes the first conductive oxide film and the second conductive oxide film respectively on the top surfaces of the first piezoelectric film 136 and the second piezoelectric film 138, thereby increasing the lifespan of the piezoelectric films.

The present embodiment describes an example in which the actuator 130 includes the first conductive oxide film and the second conductive oxide film respectively on the top surfaces of the first piezoelectric film 136 and the second piezoelectric film 138. Instead, if the actuator 130 can include a structure with more layers, conductive oxide films may also be included on the bottom surfaces of the first piezoelectric film 136 and the second piezoelectric film 138.

The present embodiment describes an example in which the actuator 130 includes the first piezoelectric film 136 and the second piezoelectric film 138 having substantially the same thickness and located at substantially the same distance from the central plane of the actuator 130 in the thickness direction. Instead, the thickness of the second piezoelectric film 138 may be less than the thickness of the first piezoelectric film 136. For example, if the actuator 130 is formed by layering a plurality of films from the first piezoelectric film 136 side to the second piezoelectric film 138 side, a larger number of layers are formed in the first piezoelectric film 136 than in the second piezoelectric film 138, and therefore the stress generated by the first piezoelectric film 136 might differ from the stress generated by the second piezoelectric film 138.

Accordingly, even if the layers are formed of a plurality of materials having substantially same thickness and at substantially the same distance from the central plane of the actuator 130 in the thickness direction, the balance between the stresses generated by the different materials can cause bowing. Furthermore, there are cases where each layered material cannot be layered to have substantially same thickness and be at substantially the same distance from the central plane of the actuator 130 in the thickness direction, in which case the absolute values of the stresses above and below the support layer 150 are different and bowing occurs.

Therefore, by setting different thicknesses for the first piezoelectric film 136 and the second piezoelectric film, the absolute values of the stresses above and below the support layer 150 can be made substantially the same, thereby restricting bowing of the actuator 130. For example, in the actuator 130, the thickness of the second piezoelectric film 138 that is formed later can be less than the thickness of the first piezoelectric film 136 formed earlier.

The thickness ratio between the first piezoelectric film 136 and the second piezoelectric film 138 may be determined according to the amount of bowing exhibited by the actuator 130. The thickness ratio between the first piezoelectric film 136 and the second piezoelectric film 138 may be set in a range from 1:1 to 1:0.5, preferably in a range from 1:1 to 1:0.8.

In the actuator 130, the thickness of the second piezoelectric film 138 formed later may be set to be less than the thickness of the first piezoelectric film 136 formed earlier, according to the direction of the bowing. In this way, in the actuator 130, the thickness ratio between the first piezoelectric film 136 and the second piezoelectric film 138 can be adjusted such that the absolute values of the stresses above and below the support layer 150 become the same and cancel each other out, thereby restricting bowing.

The present embodiment describes an example in which the second contact point section 132 is provided on the protruding section 156. Instead, the second contact point section 132 may be provided below the fourth electrode layer 168 with a protective film interposed therebetween. In this case, the actuator 130 need not include the protruding section 156.

Figure 3:
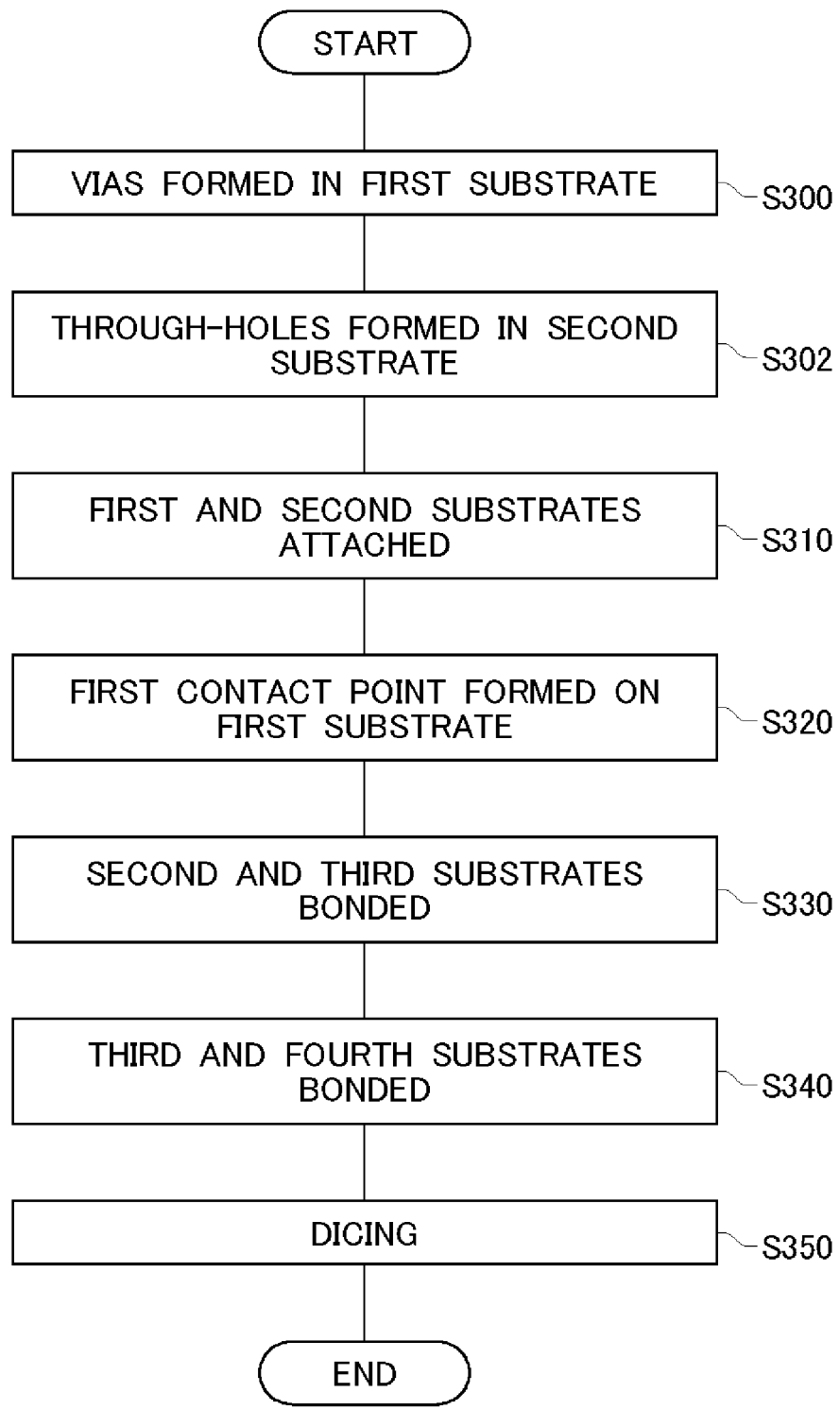
FIG. 3 shows an exemplary manufacturing method for forming the switching apparatus 100 according to the present embodiment.

FIG. 3 shows an exemplary manufacturing method for forming the switching apparatus 100 according to the present embodiment. FIGS. 4 to 8 show cross sections of the switching apparatus 100 at each stage in the process for forming the switching apparatus 100 according to the present embodiment.

Figure 4:
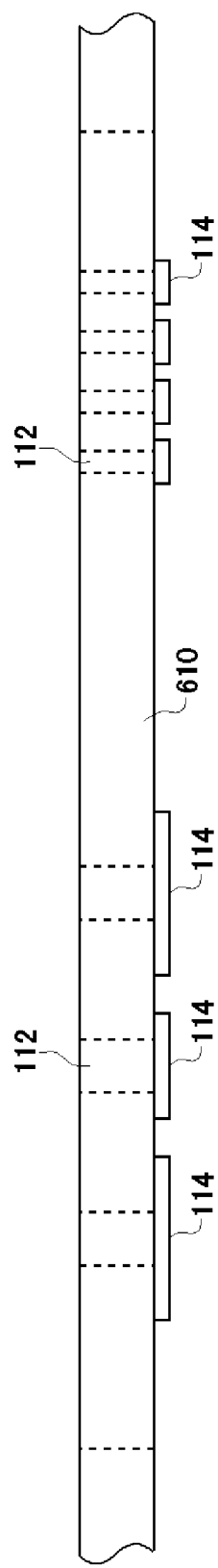
FIG. 4 shows a cross section of a stage at which the vias 112 have been formed in the first substrate 610 according to the present embodiment.

First, while maintaining an air-tight state between the top and bottom surfaces, the vias 112 that electrically connect the top and bottom surfaces are formed in the first substrate 610 (S300). A plurality of switching apparatuses 100 may be formed on the first substrate 610, and a corresponding plurality of vias 112 may also be formed. In this case, the first substrate 610 serves as the lower substrate section 110 of the switching apparatuses 100 as the result of a dicing process of cutting the substrate into individual switching apparatuses 100, as described further below. At this stage, the wiring sections 114 may be formed on the bottom surface of the first substrate 610. FIG. 4 shows a cross section of a stage at which the vias 112 have been formed in the first substrate 610 according to the present embodiment.

Next, a through-hole 622 for housing the actuator 130 is formed in the second substrate 620 (S302). The through-hole 622 of the second substrate 620 has a tapered shape in which the cross-sectional surface area parallel to the substrate surface becomes larger moving from the bottom of the second substrate 620 to the top of the second substrate 620. The cross-sectional surface area of the through-hole 622 may be substantially square, or may instead be substantially circular or substantially elliptical. The through-hole 622 may be formed by wet etching, dry etching, or sand blasting that involves machining by blowing an abrasive compound, for example. The second substrate 620 serves as the cavity section 310 of the switching apparatus 100, as the result of a dicing process of cutting the substrate into individual switching apparatuses 100, as described further below.

Figure 5:
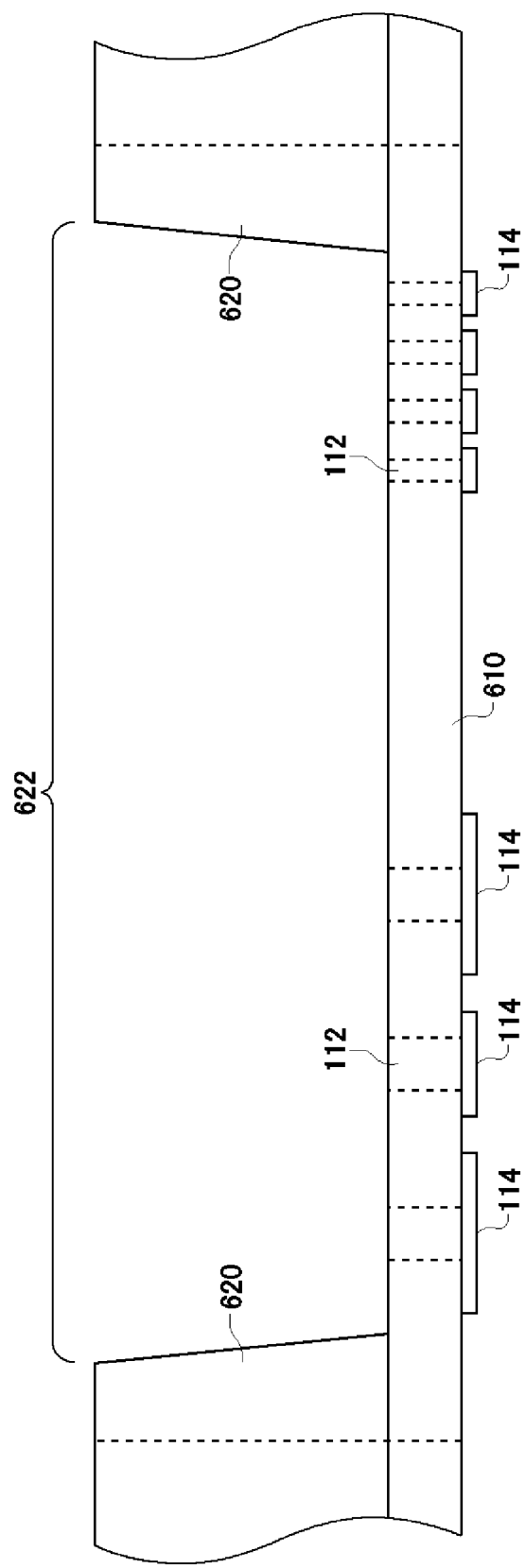
FIG. 5 shows a cross section of a stage at which the second substrate 620 has been affixed on the first substrate 610 according to the present embodiment.

Next, the bottom surface of the second substrate 620 is affixed to the top surface of the first substrate 610 (S310). The first substrate 610 and the second substrate 620 may be affixed by being heated. Since the bottom surface of the second substrate 620 is affixed to the top surface of the first substrate 610, the tapered shape of the through-hole 622 of the second substrate 620 is such that the diameter of the hole increases moving from the first substrate 610 side away from the first substrate 610. FIG. 5 shows a cross section of a stage at which the second substrate 620 has been affixed on the first substrate 610 according to the present embodiment.

Figure 6:
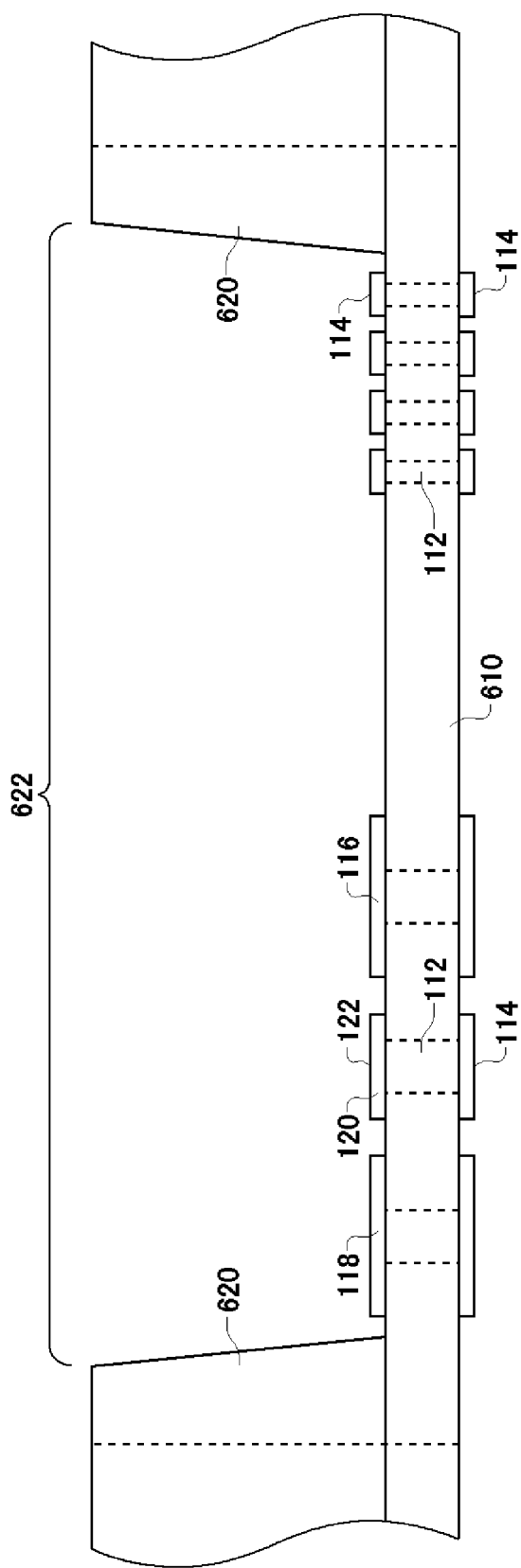
FIG. 6 shows a cross section of a stage at which the first contact points 122, the wiring sections 114, and the like have been formed on the first substrate 610 according to the present embodiment.

Next, the first contact points 122, which are fixed contact points electrically connected to vias 112, are formed on the top surface of the first substrate 610 (S320). At this stage, the wiring sections 114, the ground line 116, the ground line 118, the first signal line 120, and the second signal line 124 to be arranged on the top surface of the first substrate 610 are also formed. For example, the fixed contact points and the like may be formed by a photoresist process that involves applying a resist to serve as a mask for the fixed contact points and the like. FIG. 6 shows a cross section of a stage at which the first contact points 122, the wiring sections 114, and the like have been formed on the first substrate 610 according to the present embodiment.

Next, the third substrate 630 on which the actuator 130 including the second contact point 134, which is a movable contact point, is formed is bonded to the top surface of the second substrate 620 (S330). The second substrate 620 and the third substrate 630 may be bonded using anodic bonding, or affixed by being heated. At this stage, the actuator 130 is housed in the through-hole 622 of the second substrate 620.

The actuator 130 is formed on the third substrate 630. For example, the first protective film 152 may be formed on the third substrate 630 by depositing an insulating material using CVD, for example, and then performing annealing. Next, the first electrode layer 162, the first piezoelectric film 136, the first conductive oxide film 210, and the second electrode layer 164 are formed on the first protective film 152. The support layer 150 is then formed on the second electrode layer 164 by depositing an insulating material using CVD, for example, and then performing annealing.

Next, the third electrode layer 166, the second piezoelectric film 138, the second conductive oxide film 220, and the fourth electrode layer 168 are formed on the support layer 150. The second protective film 154 is then formed on the fourth electrode layer 168 using an insulating material, in the same manner as the support layer 150 and the first protective film 152. Next, the second contact point section 132 is formed on the protruding section 156. The third substrate 630 is then machined to form the base portion 320. The base portion 320 is formed by using etching to remove a portion of the semiconductor substrate, from a surface that is opposite the surface on which the actuator 130 is formed.

The base portion 320 may be etched using the first protective film 152 as the etching stop layer. At the present stage, one end of the actuator 130 is separated from the substrate to serve as the movable end, and the other end is fixed to the base portion 320 to serve as the fixed end. In this way, a plurality of actuators 130 may be formed on the third substrate 630.

Figure 7:
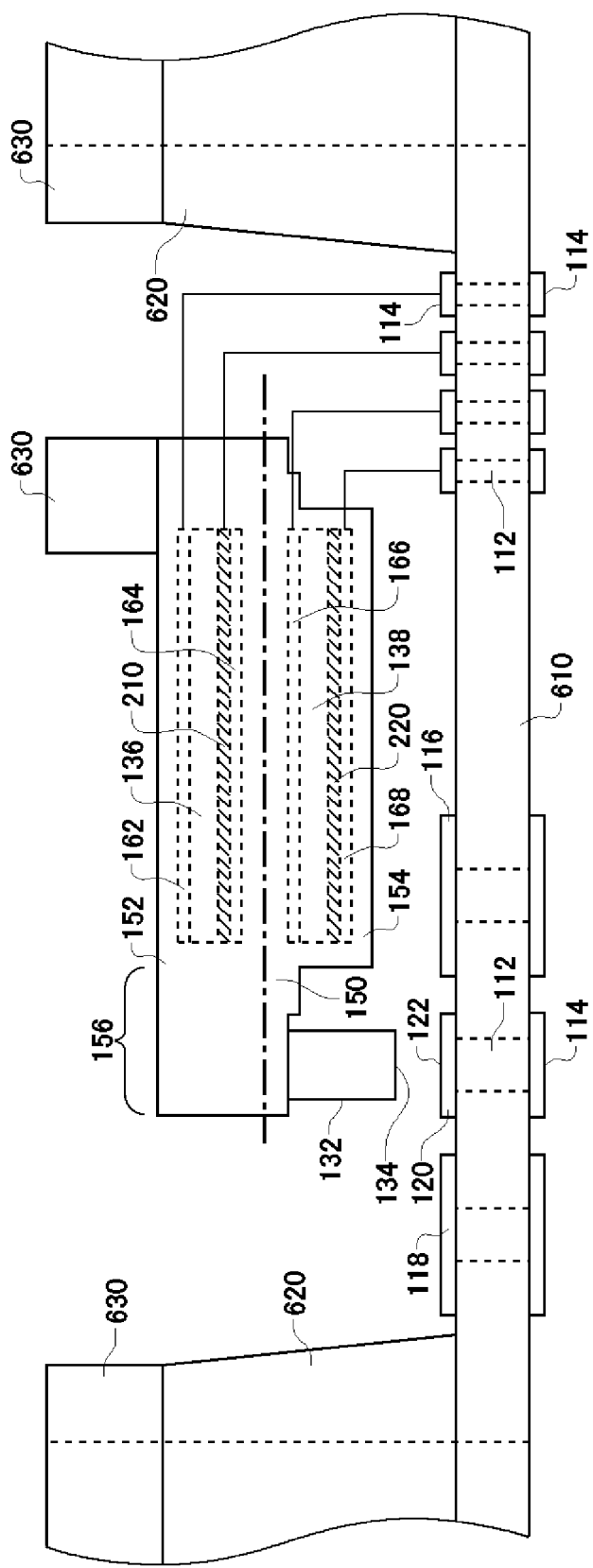
FIG. 7 shows a cross section of a stage at which the third substrate 630 is bonded on the second substrate 620 according to the present embodiment.

After the second substrate 620 and the third substrate 630 are bonded, the electrodes of the actuator 130 may be electrically connected to the corresponding wiring sections 114 on the first substrate 610. The third substrate 630 serves as the base portion 320 of the switching apparatus 100, as the result of a dicing process of cutting the substrate into individual switching apparatuses 100, as described further below. FIG. 7 shows a cross section of a stage at which the third substrate 630 is bonded on the second substrate 620 according to the present embodiment.

Next, the third substrate 630 and the fourth substrate 640 are bonded (S340). The fourth substrate 640 seals the opening of the through-hole 622 of the second substrate 620 on the side opposite the third substrate 630. The third substrate 630 and the fourth substrate 640 may be bonded using anodic bonding, or may be affixed by being heated. In this way, the actuator 130 may be sealed within the through-hole 622 of the second substrate 620. The first substrate 610, the second substrate 620, and the fourth substrate 640 may be formed of a glass material.

Figure 8:
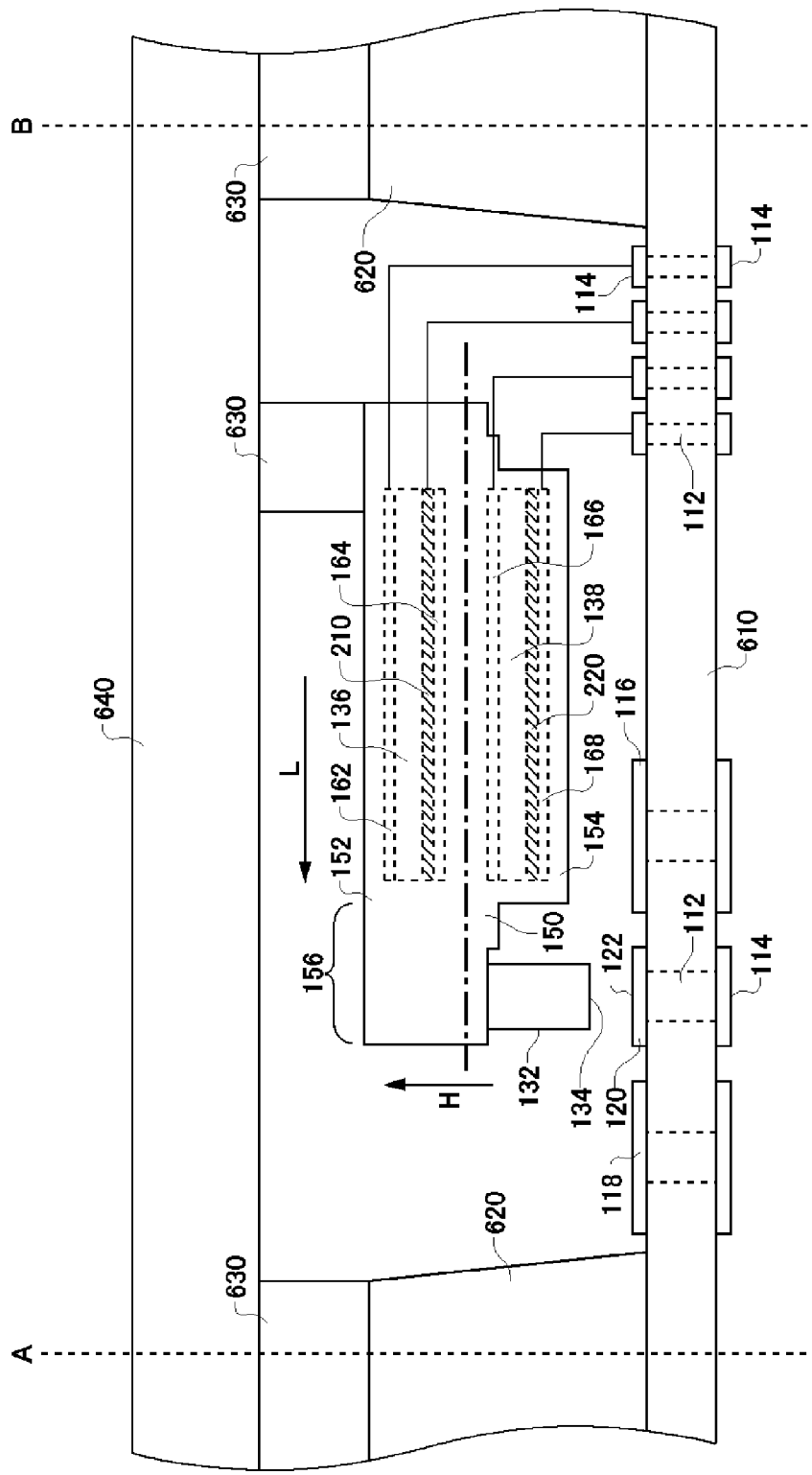
FIG. 8 shows a cross section of a stage at which the fourth substrate 640 is bonded on the third substrate 630 according to the present embodiment.

The atmosphere within the through-hole 622 may be replaced with a nonvolatile gas such as nitrogen and then sealed. The fourth substrate 640 serves as the upper substrate section 330 of the switching apparatus 100, as the result of a dicing process of cutting the substrate into individual switching apparatuses 100, as described further below. FIG. 8 shows a cross section of a stage at which the fourth substrate 640 is bonded on the third substrate 630 according to the present embodiment.

Next, the first substrate 610, the second substrate 620, the third substrate 630, and the fourth substrate 640 are diced to form individual switching apparatuses 100 (S350). For example, the dicing may be performed along the dashed lines A-A' and B-B' shown in FIG. 8 to form a package in which the actuator 130 is sealed. The diced switching apparatus 100 is electrically connected to the first power supply section 180, the second power supply section 182, and the reference voltage 184, thereby forming the switching apparatus 100 as shown in FIG. 2.

Conventionally, one substrate is machined to form the cavity in which the actuator 130 is housed and the vias, contact points, and wiring are then formed on the bottom of the cavity, which is the machined surface. Therefore, it is difficult to form the vias accurately on the surface made rough by the machining. Furthermore, the depth of the machined cavity directly affects the distance between the fixed contact point at the bottom of the cavity and the movable contact point of the actuator 130, and therefore the machining accuracy in the depth direction must be high in order to form a switching apparatus 100 that reliably performs switching. However, it is difficult to achieve high accuracy in the depth direction using machining techniques such as etching or sand blasting for forming the cavity.

In contrast, the switching apparatus 100 according to the present embodiment affixes the first substrate 610 including the vias 112 to the second substrate 620 including the through-hole 622 that houses the actuator 130, thereby forming the lower substrate section 110 and the cavity section 310. Accordingly, the vias 112 and the like are not formed on a rough machined surface, and therefore the vias 112 and the like can be formed accurately. Furthermore, the distance between the second contact point 134 of the actuator 130 and the first contact points 122 of the lower substrate section 110 is directly affected by the thickness of the second substrate 620 serving as the cavity section 310.

The thickness of the substrate can be set with polishing accuracy by polishing the substrate surface, and this is more precise than the accuracy in the depth direction of the machining used to form the cavity. Accordingly, the switching apparatus 100 of the present embodiment can perform the switching while restricting bowing of the actuator 130 and increasing the accuracy of the distance between contact points.

In the switching apparatus 100 of the present embodiment, the second substrate 620 includes the through-hole 622 having a tapered shape in which the hole diameter increases moving from the first substrate 610 side to the third substrate 630 side. Therefore, at the stage when the first contact points 122 and the like are formed on the top surface of the first substrate 610, the resist serving as the mask for the fixed contact points and the like can be easily applied and removed. Furthermore, in the switching apparatus 100, since the second substrate 620 is affixed to the first substrate 610 after forming the through-hole 622 having a tapered shape in the second substrate 620, the through-hole 622 housing the actuator 130 can be formed while forming a shape that allows for easy application and removal of the resist.

Figure 9:
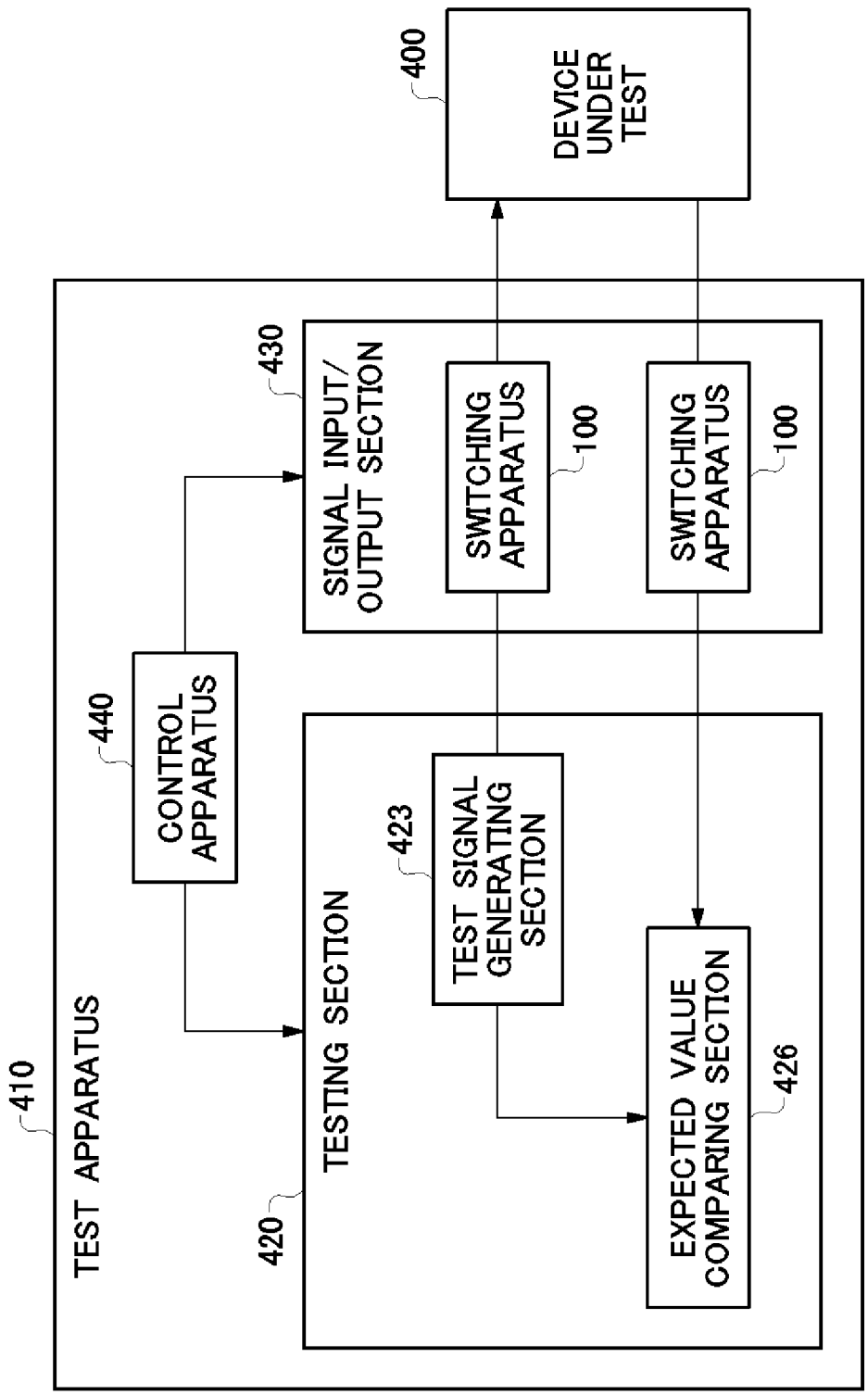
FIG. 9 shows an exemplary configuration of a test apparatus 410 according to the present embodiment, along with a device under test 400.

FIG. 9 shows an exemplary configuration of a test apparatus 410 according to the present embodiment, along with a device under test 400. The test apparatus 410 tests at least one device under test 400, which may be an analog circuit, a digital circuit, an analog/digital mixed circuit, a memory, or a system on chip (SOC), for example. The test apparatus 410 supplies the device under test 400 with a test signal based on a test pattern for testing the device under test 400, and judges pass/fail of the device under test 400 based on an output signal output by the device under test 400 in response to the test signal.

The test apparatus 410 includes a testing section 420, a signal input/output section 430, and a control apparatus 440. The testing section 420 tests the device under test 400 by exchanging electric signals with the device under test 400.

The testing section 420 includes a test signal generating section 423 and an expected value comparing section 426.

The test signal generating section 423 is connected to one or more devices under test 400, via the signal input/output section 430, and generates a plurality of test signals to be supplied to the device under test 400. The test signal generating section 423 may generate expected values for the response signals output by the device under test 400 in response to the test signals.

The expected value comparing section 426 compares the data value included in the response signal of the device under test 400 received from the signal input/output section 430 to an expected value generated by the test signal generating section 423. The expected value comparing section 426 judges pass/fail of the device under test 400 based on the comparison result.

The signal input/output section 430 provides an electrical connection between the testing section 420 and the device under test 400 to be tested, and transmits test signals generated by the test signal generating section 423 to this device under test 400. The signal input/output section 430 receives response signals output by the device under test 400 in response to the test signals. The signal input/output section 430 transmits the received response signals of the device under test 400 to the expected value comparing section 426. The signal input/output section 430 may be a performance board mounted on a plurality of devices under test 400. The signal input/output section 430 includes the switching apparatus 100.

The switching apparatus 100 is provided between the testing section 420 and the device under test 400, and provides an electrical connection or disconnection between the testing section 420 and the device under test 400. The test apparatus 410 performs electrical connecting or disconnecting using the switching apparatus 100 according to the present embodiment.

The present embodiment describes an example in which the signal input/output section 430 is connected to one device under test 400, and one switching apparatus 100 is provided to each of the input signal line and the output signal line of the one device under test 400. Instead, the signal input/output section 430 may be connected to a plurality of devices under test 400, and one switching apparatus 100 may be provided to each input signal line and output signal line of each device under test 400. If there is one input/output signal line connecting the signal input/output section 430 to the device under test 400, one switching apparatus 100 may be provided to the one input/output line.

The control apparatus 440 transmits a control signal to the testing section 420 and the signal input/output section 430, to begin execution of the testing by the test apparatus 410. The control apparatus 440 transmits a control signal that causes the testing section 420 to perform a comparison between the test result and the expected value or to generate a test signal, for example, according to a test program. Furthermore, according to the test program, the control apparatus 440 transmits to the signal input/output section 430 instructions for connecting the switching apparatuses 100 provided to signal input/output lines to be connected and instructions for disconnecting the switching apparatuses 100 provided to signal input/output lines to be disconnected.

The test apparatus 410 according to the present embodiment described above can perform testing using a switching apparatus 100 that includes an actuator 130 that can prevent physical damage such as cracking, chipping, and fracturing while increasing rigidity. Furthermore, the test apparatus 410 can perform testing using a switching apparatus 100 with good accuracy while using switching control having low power consumption due to voltage control. Yet further, the test apparatus 410 can perform testing using a switching apparatus 100 having increased yield as the result of accurate machining.

Figure 10:
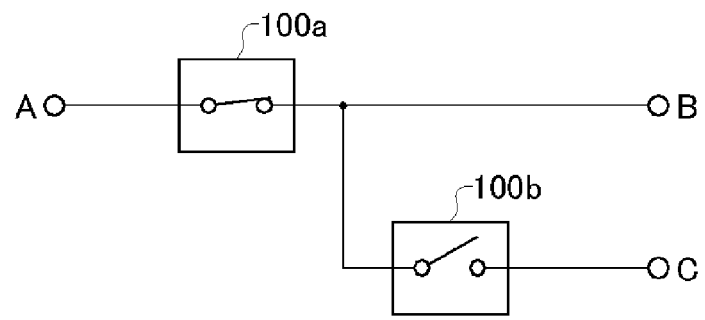
FIG. 10 shows an exemplary configuration of a transmission line switching apparatus 500 according to the present embodiment.

FIG. 10 shows an exemplary configuration of a transmission line switching apparatus 500 according to the present embodiment. The transmission line switching apparatus 500 includes a plurality of switching apparatuses 100 that are each connected between an input end and a corresponding one of a plurality of output ends. The transmission line switching apparatus 500 of the present embodiment includes a switching apparatus 100a and a switching apparatus 100b that are respectively between an input end A and output ends B and C.

The transmission line switching apparatus 500 electrically connects the input end A to the output end B and disconnects the input end A from the output end C, by turning ON the switching apparatus 100a and turning OFF the switching apparatus 100b. Furthermore, the transmission line switching apparatus 500 electrically disconnects the input end A from both the output end B and the output end C and electrically connects the output end B to the output end C, by turning OFF the switching apparatus 100a and turning ON the switching apparatus 100b.

In this way, the transmission line switching apparatus 500 can switch the transmission path between the input end and the plurality of output ends by turning the plurality of switching apparatuses ON and OFF. The transmission line switching apparatus 500 may be an apparatus in which a plurality of switching apparatuses are housed and sealed within one package, for example.

Figure 11:
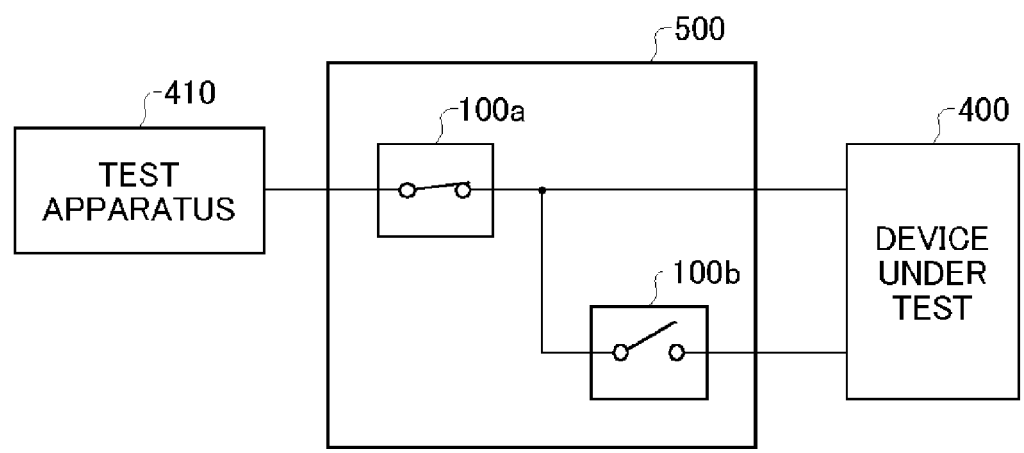
FIG. 11 shows an exemplary configuration of a test apparatus performing a loop-back test according to the present embodiment, along with the device under test 400.

FIG. 11 shows an exemplary configuration of a test apparatus performing a loop-back test according to the present embodiment, along with the device under test 400. The test apparatus performing the loop-back test of the present embodiment is formed by combining the test apparatus 410 described in FIG. 9 and the transmission line switching apparatus 500 described in FIG. 10. Therefore, components that are substantially the same as those of the test apparatus 410 or the transmission line switching apparatus 500 of the present embodiment described in FIGS. 9 and 10 are given the same reference numerals, and descriptions thereof are omitted.

When the supplying a test signal from the test apparatus 410 to the device under test 400, the test apparatus of the present embodiment turns ON the switching apparatus 100a of the transmission line switching apparatus 500 and turns OFF the switching apparatus 100b. Furthermore, when looping the signal output from the device under test 400 back to the device under test 400, the test apparatus of the present embodiment turns OFF the switching apparatus 100a of the transmission line switching apparatus 500 and turns ON the switching apparatus 100b.

In this way, the test apparatus of the present embodiment can switch between a transmission path by which a test signal for testing the device under test 400 is transmitted from the test apparatus 410 to the device under test 400 and a transmission path by which a signal from the device under test 400 is looped back and input to the device under test 400. The test apparatus performing the loop-back test of the present embodiment includes one transmission line switching apparatus 500 in the example described above, but instead, the test apparatus of the present embodiment may include two or more transmission line switching apparatuses 500. In this case, the test apparatus of the present embodiment may switch between testing of the device under test 400 using a test signal and the loop-back test, by switching among a plurality of transmission paths between the test apparatus 410 and the device under test 400.

The test apparatus for performing the loop-back test of the present embodiment described above can switch between testing with a test signal and a loop-back test, using switching apparatuses 100 that each include an actuator 130 that can prevent physical damage such as cracking, chipping, and fracturing while increasing rigidity. Furthermore, the test apparatus of the present embodiment switch between two types of testing using switching apparatuses 100 with a longer lifespan and switching control with low power consumption by controlling the voltage. Yet further, the test apparatus of the present embodiment can switch between two types of testing using switching apparatuses 100 that have increased yield due to accurate machining.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A switching apparatus comprising:
    a first substrate provided with a via that electrically connects a top surface thereof and a bottom surface thereof, while maintaining an air-tight state between the top surface and the bottom surface;
    a second substrate provided on the first substrate and in which is formed a through-hole that houses an actuator; and
    a third substrate provided on the second substrate and supporting the actuator, which has a moveable contact point;
    wherein the actuator includes
        a support layer,
        a first piezoelectric film formed on a top surface of the support layer,
        a second piezoelectric film that is provided on a surface of the support layer opposite the surface on which the first piezoelectric film is formed, facing the first piezoelectric film across the support layer, and that expands and contracts according to drive voltage to change a bowing amount of the actuator,
        electrode layers that are respectively provided on top surfaces and bottom surfaces of each of the first piezoelectric film and the second piezoelectric film and apply drive voltages thereto, and
        a second conductive oxide film that has a conductive oxide formed between the second piezoelectric film and the electrode layer on a side of the second piezoelectric film opposite the support layer.

2. The switching apparatus according to claim 1, wherein the first substrate includes a fixed contact point that is electrically connected to the via on the top surface, and the actuator electrically connects or disconnects the movable contact point to or from the fixed contact point, according to application of drive voltage to a piezoelectric film of the actuator.

3. The switching apparatus according to claim 1, wherein the through-hole of the second substrate has a tapered shape moving from the first substrate side toward the third substrate side.

4. The switching apparatus according to claim 1, wherein the actuator further includes a first conductive oxide film that has a conductive oxide formed between the first piezoelectric film and the electrode layer on a side of the first piezoelectric film opposite the support layer.

5. The switching apparatus according to claim 1, wherein a main component of the conductive oxide film is an Ir-type oxide such as IrO2, a Ru-type oxide such as RuO2 or SRO, or an oxide including LSCO or LNO.

6. The switching apparatus according to claim 1 wherein the first piezoelectric film and the second piezoelectric film are PZT films.

7. The switching apparatus according to claim 1 wherein the actuator further includes:
    a first protective film that is formed by an insulating material, covers at least a portion of the first piezoelectric film from a side of the first piezoelectric film that is opposite the support layer, and contacts the support layer at least at a portion of an end portion of the first piezoelectric film; and
    a second protective film that is formed by an insulating material, covers at least a portion of the second piezoelectric film from a side of the second piezoelectric film that is opposite the support layer, and contacts the support layer at least at a portion of an end portion of the second piezoelectric film.

8. The switching apparatus according to claim 1 wherein the support layer is formed by an insulating material.

9. The switching apparatus according to claim 8, wherein the insulating material includes SiO2 or SiN.

10. The switching apparatus according to claim 1, wherein the first substrate and the second substrate are formed by a glass material.

11. A transmission line switching apparatus comprising an input end, a plurality of output ends, and a plurality of the switching apparatuses according to claim 1 respectively connected between the input end and the plurality of output ends.

12. A test apparatus that performs a loop-back test on a device under test, the test apparatus comprising:
    a testing section that tests the device under test by exchanging electrical signals with the device under test; and
    the transmission line switching apparatus according to claim 11 that is provided between the testing section and the device under test such that the input end is connected to the testing section, and the plurality of output ends are connected to the device under test, wherein the transmission line switching apparatus switches between supplying the device under test with a signal from the testing section and looping a signal from the device under test back to the device under test.

13. A test apparatus that tests a device under test, the test apparatus comprising:
    a testing section connectable to the device under test that tests the device under test by exchanging electrical signals with the device under test; and
    the switching apparatus according to claim 1 that is provided between the testing section and the device under test and provides an electrical connection or disconnection between the testing section and the device under test.

14. A switching apparatus comprising:
    a first substrate provided with a via that electrically connects a top surface thereof and a bottom surface thereof, while maintaining an air-tight state between the top surface and the bottom surface;
    a second substrate provided on the first substrate and in which is formed a through-hole that houses an actuator;
    a third substrate provided on the second substrate and supporting the actuator, which has a moveable contact point; and
    a fourth substrate that seals an opening of the second substrate on an opposite side of the third substrate.

15. The switching apparatus according to claim 14, wherein
    the first substrate includes a fixed contact point that is electrically connected to the via on the top surface, and
    the actuator electrically connects or disconnects the movable contact point to or from the fixed contact point, according to application of drive voltage to a piezoelectric film of the actuator.

16. The switching apparatus according to claim 14, wherein
    the through-hole of the second substrate has a tapered shape moving from the first substrate side toward the third substrate side.

17. The switching apparatus according to claim 14, wherein
    the first substrate and the second substrate are formed by a glass material.

18. A transmission line switching apparatus comprising a plurality of the switching apparatuses according to claim 14 respectively connected between an input end and a plurality of output ends.

19. A test apparatus that performs a loop-back test on a device under test, the test apparatus comprising:
    a testing section that tests the device under test by exchanging electrical signals with the device under test; and
    the transmission line switching apparatus according to claim 18 that is provided between the testing section and the device under test and switches between supplying the device under test with a signal from the testing section and looping a signal from the device under test back to the device under test.

20. A test apparatus that tests a device under test, the test apparatus comprising:
    a testing section that tests the device under test by exchanging electrical signals with the device under test; and
    the switching apparatus according to claim 14 that is provided between the testing section and the device under test and provides an electrical connection or disconnection between the testing section and the device under test.

* * * * *